(12) United States Patent
Fenigstein et al.

(10) Patent No.: US 7,754,564 B2
(45) Date of Patent: Jul. 13, 2010

(54) METHOD FOR FABRICATING THREE-DIMENSIONAL CONTROL-GATE ARCHITECTURE FOR SINGLE POLY EPROM MEMORY DEVICES IN PLANAR CMOS TECHNOLOGY

(75) Inventors: Amos Fenigstein, Migdal Haemek (IL); Zohar Kuritsky, Migdal Haemek (IL); Assaf Lahav, Migdal Haemek (IL); Ira Naot, Migdal Haemek (IL); Yakov Roizin, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 134 days.

(21) Appl. No.: 12/046,913

(22) Filed: Mar. 12, 2008

(65) Prior Publication Data
US 2008/0160689 A1 Jul. 3, 2008

Related U.S. Application Data

(62) Division of application No. 11/326,582, filed on Jan. 4, 2006, now Pat. No. 7,671,396.

(51) Int. Cl.
*H01L 21/336* (2006.01)

(52) U.S. Cl. ............... 438/257; 257/313; 257/E27.084; 257/E29.345

(58) Field of Classification Search ............. 438/257; 257/295, 296, 300, 313, 532, E27.084, E29.345
See application file for complete search history.

(56) References Cited

U.S. PATENT DOCUMENTS

| | | | |
|---|---|---|---|
| 5,272,368 A | 12/1993 | Turner et al. | |
| 5,619,942 A | 4/1997 | Stewart et al. | |
| 5,912,509 A | 6/1999 | Kasai et al. | |
| 6,146,939 A | 11/2000 | Dasgupta | |
| 6,483,139 B1 | 11/2002 | Arimoto et al. | |
| 6,489,650 B2 | 12/2002 | Kumazaki | |
| 6,788,576 B2 | 9/2004 | Roizin | |

(Continued)

OTHER PUBLICATIONS

Buchanan "Scaling the Gate Dielectric: Materials, Integration and Reliability", IBM J. Res. Develop. vol. 43, No. 3, May 1999, pp. 245-264.

(Continued)

*Primary Examiner*—Ha Tran T Nguyen
*Assistant Examiner*—Shaun Campbell
(74) *Attorney, Agent, or Firm*—Bever, Hoffman & Harms, LLP; E. Eric Hoffman

(57) ABSTRACT

A capacitor for a single-poly floating gate device is fabricated on a semiconductor substrate along with low and high voltage transistors. Each transistor has a gate width greater than or equal to a minimum gate width of the associated process. A dielectric layer is formed over the substrate, and a patterned polysilicon structure is formed over the dielectric layer. The patterned polysilicon structure includes one or more narrow polysilicon lines, each having a width less than the minimum gate width. The LDD implants for low and high voltage transistors of the same conductivity type are allowed to enter the substrate, using the patterned polysilicon structure as a mask. A thermal drive-in cycle results in a continuous diffusion region that merges under the narrow polysilicon lines. Contacts formed adjacent to the narrow polysilicon lines and a metal-1 trace connected to the contacts may increase the resulting capacitance.

14 Claims, 10 Drawing Sheets

U.S. PATENT DOCUMENTS

| | | |
|---|---|---|
| 6,818,943 B2 | 11/2004 | Kumazaki |
| 6,842,327 B1 | 1/2005 | Diorio et al. |
| 2006/0033141 A1 | 2/2006 | Okazaki et al. |
| 2006/0289923 A1* | 12/2006 | Jones .................... 257/315 |
| 2007/0166912 A1 | 7/2007 | Fenigstein et al. |
| 2007/0279987 A1 | 12/2007 | Fang et al. |

OTHER PUBLICATIONS

Chang et al. "A Low Voltage, Low Power P-Channel EEPROM Cell for Embedded and System-On-A-Chip Applications", pp. 1-4.

Kwok "An Innovative NVM Technology for Sub-0.25μm SOC Applications", Programmable Microelectronics Corp. (PMC) Flash, CASPA/CIE System-on-Chip (SOC) Symposium, May 16, 1998, pp. 1-24.

Lee et al. "High-Performance EEPROM's Using N- and P-Channel Polysilicon Thin-Film Transistors with Electron Cyclotron Resonance $N_2O$-Plasma Oxide", IEEE Electron Device Letters, vol. 20, No. 1, Jan. 1999, pp. 15-17.

* cited by examiner

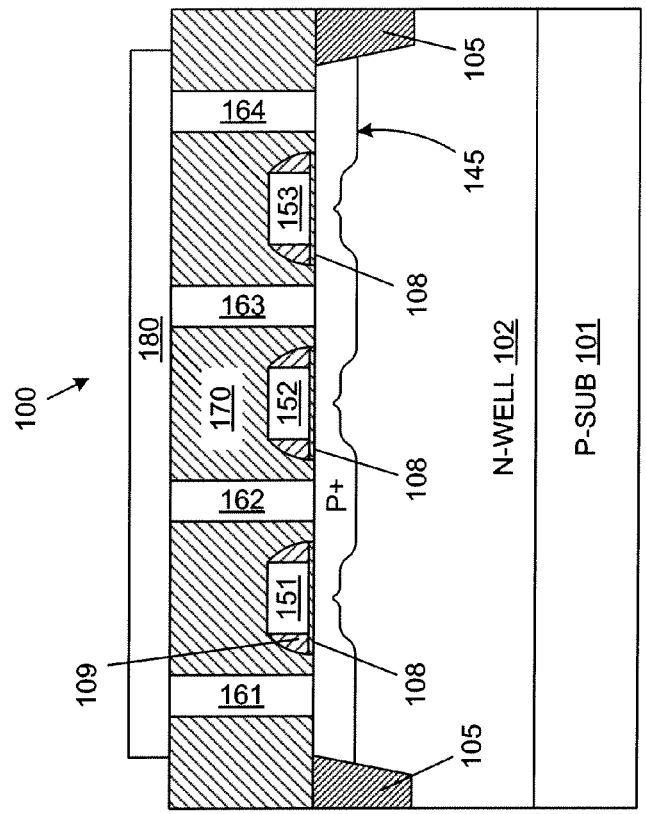
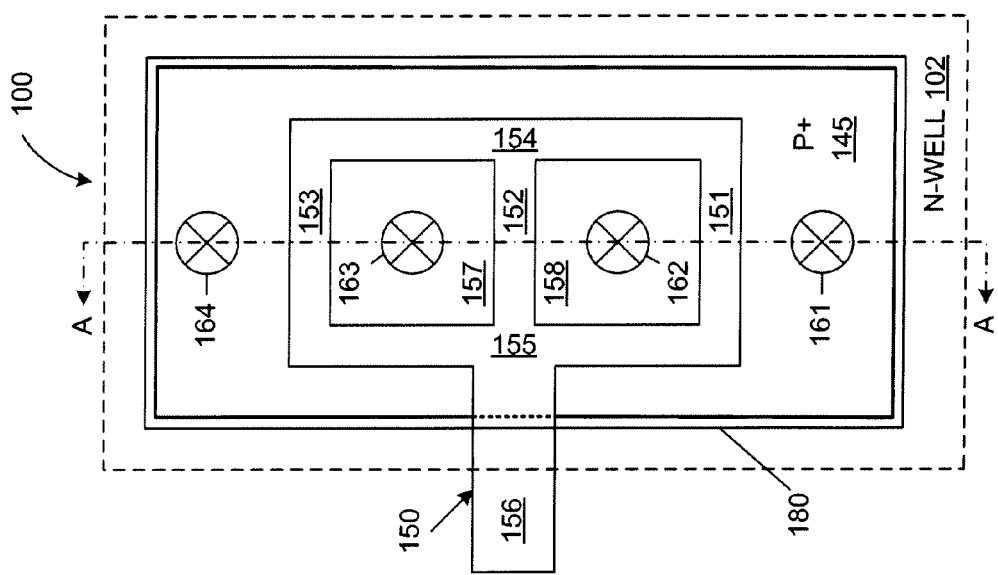
FIG. 1
FIG. 2

METHOD FOR FABRICATING THREE-DIMENSIONAL CONTROL-GATE ARCHITECTURE FOR SINGLE POLY EPROM MEMORY DEVICES IN PLANAR CMOS TECHNOLOGY

RELATED APPLICATIONS

This application is a divisional of U.S. patent application Ser. No. 11/326,582, entitled "Three Dimensional Control-Gate Architecture For Single Poly EPROM Memory Devices Fabricated In Planar CMOS Technology" filed Jan. 4, 2006.

FIELD OF THE INVENTION

The present invention relates to an EEPROM control gate fabricated using a standard planar CMOS fabrication process.

RELATED ART

The main limitation of single-poly CMOS non-volatile semiconductor memory (NVSM) designs is a large cell area. One option to decrease the cell area is to form a control gate of the cell in the substrate. A single-poly non-volatile memory device using p-type and n-type doped layers underneath a single-poly gate layer has been described. Kwok et al., "An Innovative NVM Technology for Sub-0.25 um SOC Applications", CASPA/CIE System-on-Chip (SOC) Symposium May 16, 1998, pp. 1-24.

Nae-In Lee et al. report an EEPROM device that uses a PMOS transistor structure as the control gate for a NMOS EEPROM device. Lee et al., "High-Performance EEPROM's Using N- and P-Channel Polysilicon Thin-Film Transistors with Electron Cyclotron Resonance N20-Plasma Oxide", IEEE Electron Device Letters, Vol. 20, No. 1, January 1999, pp. 15-17. Kumazaki (U.S. Pat. Nos. 6,818,943 and 6,489,650) reports an EEPROM single-poly device with a floating gate formed as a diffusion under a polysilicon layer, wherein the diffusion is formed by a special implant into a silicon-on-insulator substrate prior to formation of the floating gate.

The above-listed devices require special lithography and ion implant doping steps that must be performed before the gate oxide is formed, thus adding complexity to the fabrication process.

The quality of the gate oxide that is thermally grown on heavily doped silicon regions is not adequate to provide a capacitive structure for a non-volatile memory cell.

The use of a PMOS or NMOS capacitor (transistor) as a control gate of a non-volatile memory cell results in a highly non-linear control gate capacitance.

It would therefore be desirable to have a low cost NVSM embedded memory that is easily integrated into a conventional planar CMOS process, preferably with no additional operations. It would further be desirable to have a high quality control gate capacitor structure with a relatively small size.

SUMMARY

Accordingly, the present invention provides a three-dimensional capacitor structure that combines various types of capacitance, including polysilicon-to-substrate capacitance, contact-to-polysilicon capacitance and metal-to-polysilicon capacitance to obtain a large capacitance in a small volume, thereby increasing the coupling ratio of a control gate in a single-poly non-volatile semiconductor memory design.

In accordance with one embodiment, a three-dimensional capacitor structure is fabricated on a semiconductor substrate using a conventional planar CMOS process, along with low and high voltage transistors. Each of the low and high voltage transistors has a gate with a width greater than or equal to a minimum gate width of the CMOS process. For example, low voltage transistors may have a gate width of about 0.18 microns, while high voltage transistors have a gate width of about 0.35 microns.

A capacitor structure having a p-type diffusion region is fabricated as follows. A capacitor dielectric layer is formed over a first n-type region of the substrate. A patterned polysilicon structure is formed over the capacitor dielectric layer. The patterned polysilicon structure includes one or more narrow polysilicon lines, each having a width less than the minimum gate width. For example, the narrow polysilicon lines of the patterned polysilicon structure may have a width of about 0.14 microns. The patterned polysilicon structure also includes an extension region (having a width greater than or equal to the minimum gate width), which is used as the floating gate of the non-volatile memory device.

Gate dielectric layers and polysilicon gate electrodes are also formed for the low voltage and high voltage transistors. A low voltage p-type lightly doped drain (LDD) implant is performed, thereby forming lightly doped source/drain regions of the low voltage p-channel transistors. The high voltage transistors are prevented from receiving the impurities of the low voltage p-type LDD implant. However, the patterned polysilicon structure is exposed during the low voltage p-type LDD implant, such that the first region receives p-type impurities during this step.

A high voltage p-type lightly doped drain (LDD) implant is also performed, thereby forming lightly doped source/drain regions of the high voltage p-channel transistors. The low voltage transistors are prevented from receiving the impurities of the high voltage p-type LDD implant. However, the patterned polysilicon structure is exposed during the high voltage p-type LDD implant, such that the first region receives p-type impurities during this step.

During a subsequent anneal, the p-type impurities laterally diffuse within the first region of the substrate, and merge under the narrow polysilicon lines of the patterned polysilicon structure, thereby forming a continuous diffusion region. This merging occurs due to the relatively narrow widths of the narrow polysilicon lines and the relatively high dopant concentration in the first region. A first capacitive element is formed by this continuous diffusion region, the capacitor dielectric layer and the patterned polysilicon layer.

A pre-metal dielectric layer is subsequently formed over the patterned polysilicon structure (and the low and high voltage transistors). Electrically conductive contacts, which extend through the pre-metal dielectric, are then formed. A first set of these contacts are located adjacent to the narrow polysilicon lines of the patterned polysilicon structure. A second capacitive element is formed by the narrow polysilicon lines, the pre-metal dielectric layer and the first set of contacts. Dielectric sidewall spacers may be formed adjacent to the narrow polysilicon lines of the patterned polysilicon layer, thereby increasing the capacitance of the second capacitive element.

A first metal layer (metal-1) trace may be formed over the pre-metal dielectric layer, in contact with the first set of contacts. In this case, a third capacitive element is formed by the metal-1 trace, the pre-metal dielectric layer and the narrow polysilicon lines. The three capacitive elements are capable of providing a relatively high capacitance in a relatively small volume.

Advantageously, the capacitor structure can be fabricated without requiring additional masks or steps in a conventional planar CMOS process. In addition, because the continuous p-type diffusion region is formed after the capacitor dielectric layer and patterned polysilicon layer have been formed, the capacitor dielectric layer will have a relatively high quality. That is, capacitor dielectric layer can be thermally grown silicon oxide, which is not adversely affected by the presence of an underlying heavily doped p-type region.

In accordance with different variations of the present invention, some capacitor structures may only include the first capacitive element or the second capacitive element.

The present invention will be more fully understood in view of the following description and drawings.

BRIEF DESCRIPTION OF THE DRAWINGS

FIG. 1 is a top view of a three dimensional capacitor structure, which can be used to implement a control gate of a single-poly non-volatile memory (NVM) cell, in accordance with one embodiment of the present invention.

FIG. 2 is a cross-sectional view of the three dimensional capacitor structure of FIG. 1, along section line A-A.

DETAILED DESCRIPTION

Figure 3:
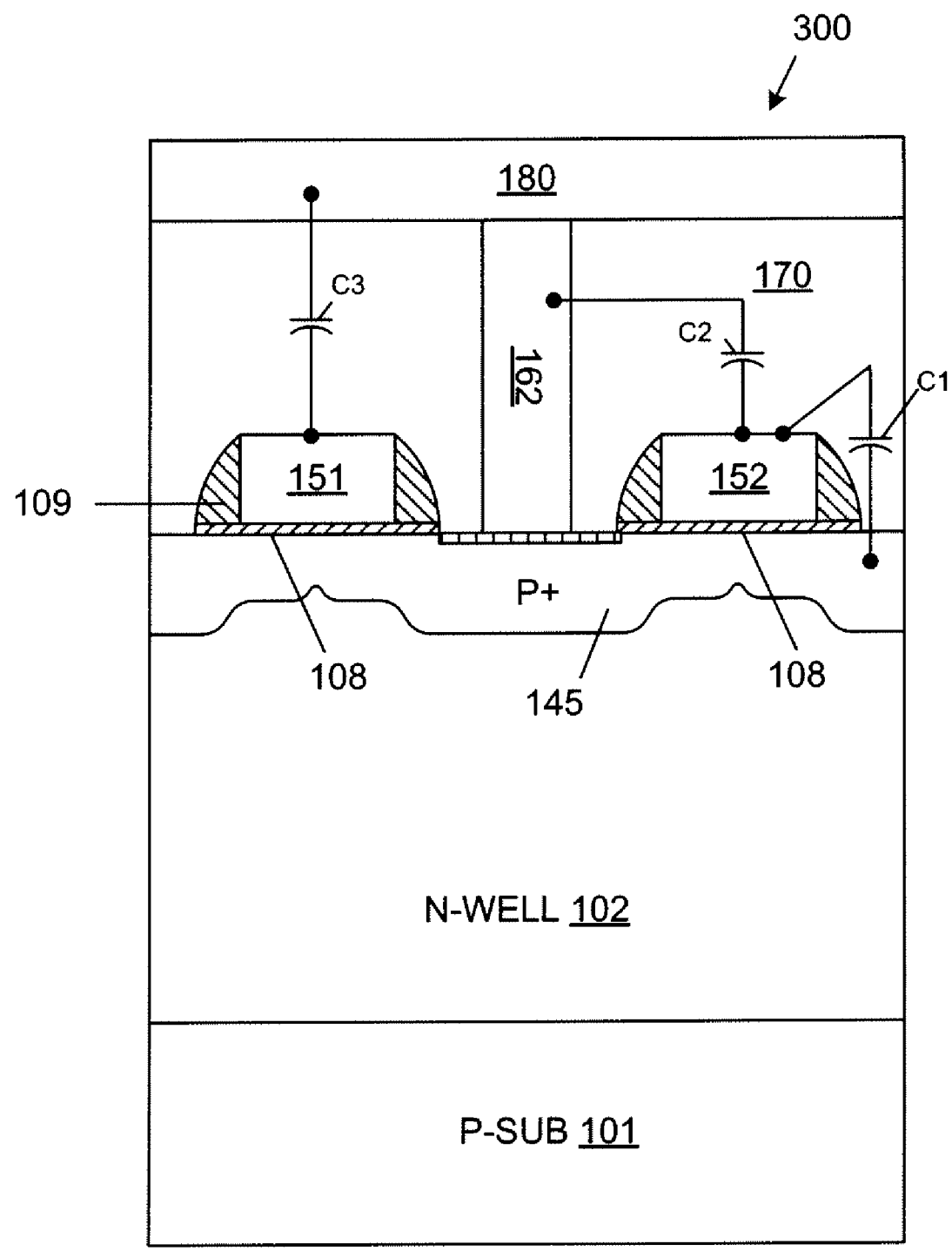
FIG. 3 is an enlarged view of a portion of FIG. 2, which includes an opening in a patterned polysilicon structure.

FIG. 1 is a top view of a capacitor structure 100, which can be used to implement a three dimensional control gate of a single-poly non-volatile memory (NVM) cell, in accordance with one embodiment of the present invention. FIG. 2 is a cross-sectional view of capacitor structure 100 along section line A-A of FIG. 1. As used herein, a single-poly NVM cell includes any NVM cell fabricated with a single polysilicon gate layer. This single polysilicon gate layer is used to form the floating gates of the NVM cells, as well as the control gates of other transistors fabricated on the same wafer. Capacitor structure 100 can be used, for example, to implement the control gate of an electrically programmable erasable read only memory (EEPROM) cell or a compact flash memory cell.

Capacitor structure 100 includes p-type monocrystalline semiconductor (e.g., silicon) substrate 101, n-type well region 102, field dielectric regions 105, capacitor dielectric layer 108, dielectric sidewall spacers 109, p-type semiconductor diffusion region 145, patterned polysilicon structure 150, contacts 161-164, pre-metal dielectric layer 170 and first metal layer (metal-1) trace 180.

Field dielectric regions 105 (e.g., shallow trench isolation (STI) regions) are formed in n-well 102, thereby isolating capacitor structure 100 from other active elements formed on substrate 101. Continuous p-type diffusion region 145 is located at the upper surface of n-well 102, and is isolated by field dielectric regions 105. Capacitor dielectric layer 108 is located over the upper surface of p-type diffusion region 145. Patterned polysilicon structure 150 is located over capacitor dielectric layer 108. Dielectric sidewall spacers 109 are located adjacent to the sidewalls of patterned polysilicon structure 150. Pre-metal dielectric layer 170 is located over patterned polysilicon structure 150, dielectric sidewall spacers 109 and capacitor dielectric layer 108. Contacts 161-164 extend through pre-metal dielectric layer 170 and contact capacitor dielectric layer 108. Metal-1 trace 180 is located over pre-metal dielectric layer 170, and contacts the upper portions of contacts 161-164.

Patterned polysilicon structure 150 includes narrow polysilicon lines 151-155 and wide polysilicon extension 156. In accordance with one embodiment, wide polysilicon extension 156 forms the floating gate of a single-poly NVM cell (not shown). Wide polysilicon extension 156 can be designed to have a width corresponding with the minimum gate width of the associated CMOS process. For example, wide polysilicon extension 156 may have a width of 0.18 microns in a 0.18 micron CMOS process. Narrow polysilicon lines 151-155 each have a width less than the minimum gate width of the associated CMOS process. For example, each of narrow polysilicon lines 151-155 can have a width of about 0.14 microns in a 0.18 micron CMOS process. As described in more detail below, the width of narrow polysilicon lines 151-155 is selected to be small enough that an impurity implanted through these lines will diffuse under these lines to form a continuous doped diffusion region (e.g., p-type diffusion region 145). Narrow polysilicon lines 151-155 define openings 157 and 158 in patterned polysilicon structure 150.

FIG. 3 is an enlarged view of a portion of FIG. 2, which includes the portion of patterned polysilicon structure 150 which defines opening 158. This portion of patterned polysilicon structure 150, which includes narrow polysilicon lines 151-152 and half of narrow polysilicon lines 151-155, defines a square unit cell 300 of capacitor structure 100. The capacitance of this square unit cell 300 includes three main capacitive elements C1, C2 and C3, which will now be described.

A first capacitive element C1 is formed by narrow polysilicon lines 151-152, 154-155 and p-type diffusion region 145, which are separated by capacitor dielectric layer 108. In a particular embodiment, capacitor dielectric layer 108 is a high voltage gate oxide having a thickness of about 70 Angstroms. In this embodiment, the capacitance of capacitive element C1 is about 0.5 fF/µm2. The fringe capacitance of capacitive element C1 is about 0.05 fF/µm. Assuming that the square patterned polysilicon structure has an area of about 0.45 µm2, capacitive element C1 exhibits a capacitance of about 0.25 fF.

The second capacitive element C2 is formed by narrow polysilicon lines 151-152, 154-155 and contact 162, which are separated by dielectric sidewall spacers 109 and pre-metal dielectric layer 170. In a particular embodiment, contact 162 is a tungsten plug having a diameter of about 0.22 microns, patterned polysilicon structure 150 has a thickness of about 0.2 microns, and each of the dielectric sidewall spacers 109 is silicon nitride having a width of about 0.16 microns (i.e., the distance between patterned polysilicon structure 150 and contact 162 is about 0.16 microns). In this embodiment, the capacitive element C2 exhibits a capacitance of about 0.2 fF.

The third capacitive element C3 is formed by metal-1 trace 180 and square patterned polysilicon structure, which are separated by pre-metal dielectric layer 170. In a particular embodiment, the capacitive element C3 exhibits a capacitance of about 0.05 fF.

The total capacitance CT for one unit cell is equal to the sum of the capacitances of capacitive elements C1, C2 and C3. In the described example, the capacitance CT is approximately equal to 0.5 fF (i.e., 0.25 fF+0.20 fF+0.05 fF). Because capacitor structure 100 includes two unit cells, the total capacitance of capacitor structure 100 is approximately equal to 1.0 fF.

Advantageously, the total capacitance CT includes capacitive elements C1 and C2, which exhibit the same order capacitance and have a weak dependence on voltage. Misalignment of a contact 161-164 with respect to the walls of the patterned polysilicon structure 150 is not significant, because the system is self-compensating. That is, a smaller distance between a contact and one wall of the patterned polysilicon structure 150 results in a larger distance between the contact and another wall of the patterned polysilicon structure 150. As a result, the influence of process variations on total capacitance CT is minimized.

In the foregoing manner, capacitor structure 100 provides a capacitance that can be used to implement a control gate non-volatile memory cell.

Figure 4:
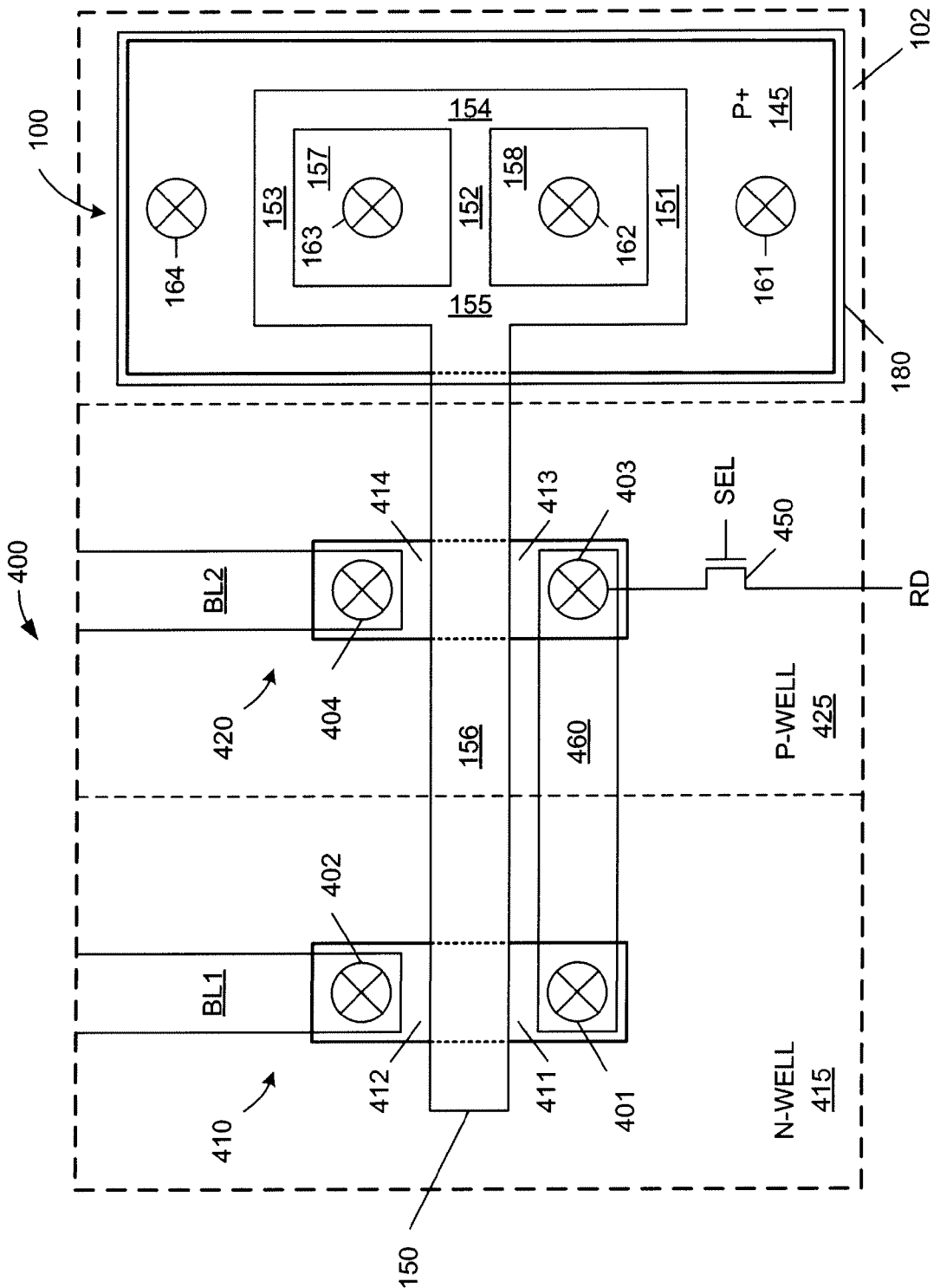
FIG. 4 is a top view of a single-poly floating gate non-volatile memory cell, which implements the three-dimensional capacitor structure of FIGS. 1-2 in accordance with one embodiment of the present invention.

FIG. 4 is a top view of a single-poly floating gate non-volatile memory cell 400, which implements capacitor structure 100 in accordance with one embodiment of the present invention. NVM cell 400 includes capacitor structure 100, p-channel field effect transistor 410, n-channel field effect transistor 420, and select transistor 450. The layout of select transistor 450 is not shown for purposes of clarity. NVM cell 400 is generally described (with a different capacitor structure) in U.S. Pat. No. 6,788,576.

P-channel transistor 410 is formed in an n-well region 415, and n-channel NVM transistor 420 is formed in a p-well region 425. P-channel transistor 410 includes a p-type drain region 411 and a p-type source region 412. N-channel transistor 420 includes an n-type drain region 413 and an n-type source region 414. Extension region 156 of patterned polysilicon structure 150 forms the gate of both p-channel transistor 410 and n-channel transistor 420. Metal bit lines BL1 and BL2 are coupled to source regions 412 and 414, respectively, of transistors 410 and 420. A metal trace 460 connects the drain regions of p-channel transistor 410 and n-channel transistor 420. The source of select transistor 450 is electrically coupled to the drains of transistors 410 and 420. The gate of select transistor 450 is coupled to receive a select signal SEL, and the drain of select transistor 450 carries a data signal RD. The capacitive coupling provided by capacitor structure 100 facilitates operation of EEPROM cell 400.

During a read operation, a read input voltage VIN is applied to metal-1 trace 180 in capacitor structure 100. The source of p-channel transistor 410 (i.e., bit line BL1) is coupled to a positive supply voltage, and the source of n-channel transistor 420 (i.e., bit line BL2) is coupled to ground. The select signal SEL is activated, thereby turning on select transistor 450. During the read operation, transistors 410 and 420 form an inverter circuit having a threshold voltage that depends on the charge stored by floating gate 150 and the coupling ratio of the capacitor structure 100. Under these conditions, an output voltage VOUT, representative of the charge stored on patterned polysilicon structure 150, is provided on metal trace 460, and is routed through select transistor 450 as the read data signal RD.

Figure 5:
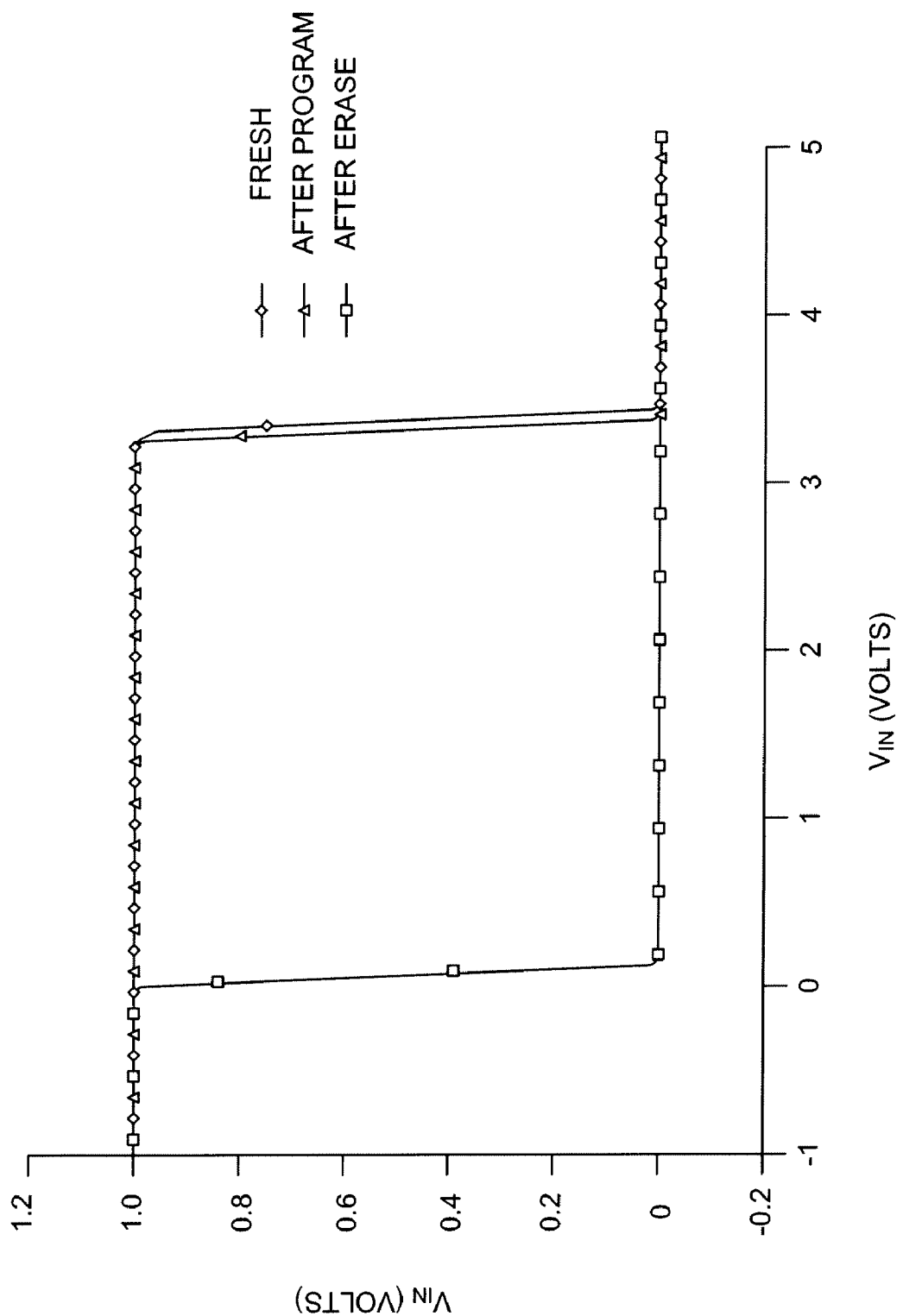
FIG. 5 is a CMOS inverter transfer curve illustrating the response of the non-volatile memory cell of FIG. 4.

FIG. 5 is a CMOS inverter transfer curve 500 illustrating the response of the output voltage VOUT in response to the input voltage VIN, when memory cell 400 is programmed, erased or fresh. The CMOS inverter transfer curve 500 is determined by measuring the output voltage VOUT while sweeping the input voltage VIN from −1 Volt to 5 Volts. As illustrated in FIG. 5, if memory cell 400 is fresh (i.e., has not been programmed or erased) or programmed, the inverter has a relatively high threshold voltage, such that p-channel transistor 410 is initially turned on and n-channel transistor is initially turned off. Under these conditions, the output voltage VOUT is approximately equal to the voltage on bit line BL1 (i.e., 1 Volt). The output voltage VOUT remains at 1 Volt until the input voltage VIN is increased to about 3.25 Volts. At this time, n-channel transistor 420 turns on and p-channel transistor 410 turns off, thereby causing the output voltage VOUT to become equal to the voltage on bit line BL2 (i.e., 0 Volts).

If memory cell 400 is erased, the inverter has a relatively low threshold voltage, such that p-channel transistor is initially turned off and n-channel transistor 420 is initially turned on, such that the output the output voltage VOUT is approximately equal to the voltage on bit line BL1 (i.e., 1 Volt). The output voltage VOUT remains at 1 Volt until the input voltage VIN is increased to about 0 Volts. At this time, n-channel transistor 420 turns on and p-channel transistor 410 turns off, thereby causing the output voltage VOUT to become equal to the voltage on bit line BL2 (i.e., 0 Volts).

The characteristics illustrated in FIG. 5 are typical for a high quality CMOS inverter, and shows that the control gate coupling ratio is about 90%. The same slope of transfer curves for initial, programmed and erased cells further confirms the high quality (i.e., constant capacitance) of the control gate.

The fabrication of capacitor structure 100 in accordance with one embodiment of the present invention will now be described. In this embodiment, capacitor structure 100 is fabricated using a conventional 0.18 micron planar CMOS (single-poly) process. This CMOS process includes both low voltage transistors and high voltage transistors. For example, low voltage transistors may have a gate length of 0.18 microns, and high voltage transistors may have a gate length of 0.35 microns. Other conventional processes can be used in other embodiments.

Because the fabrication of capacitor structure 100 is related to the fabrication of the low voltage transistors and the high voltage transistors typically available in a conventional CMOS process, the following description will also include the fabrication of a low voltage transistor and a high voltage transistor, which are fabricated on the same chip as capacitor structure 100.

FIGS. 6A-6D are cross sectional views of capacitor structure 100, a low voltage PMOS transistor 610 and a high voltage PMOS transistor 620, during various processing steps, in accordance with one embodiment of the present invention. Low voltage PMOS transistor 610, high voltage PMOS transistor 620 and capacitor structure 100, are fabricated in regions 601, 602 and 603, respectively, of substrate 101.

Figure 6A:
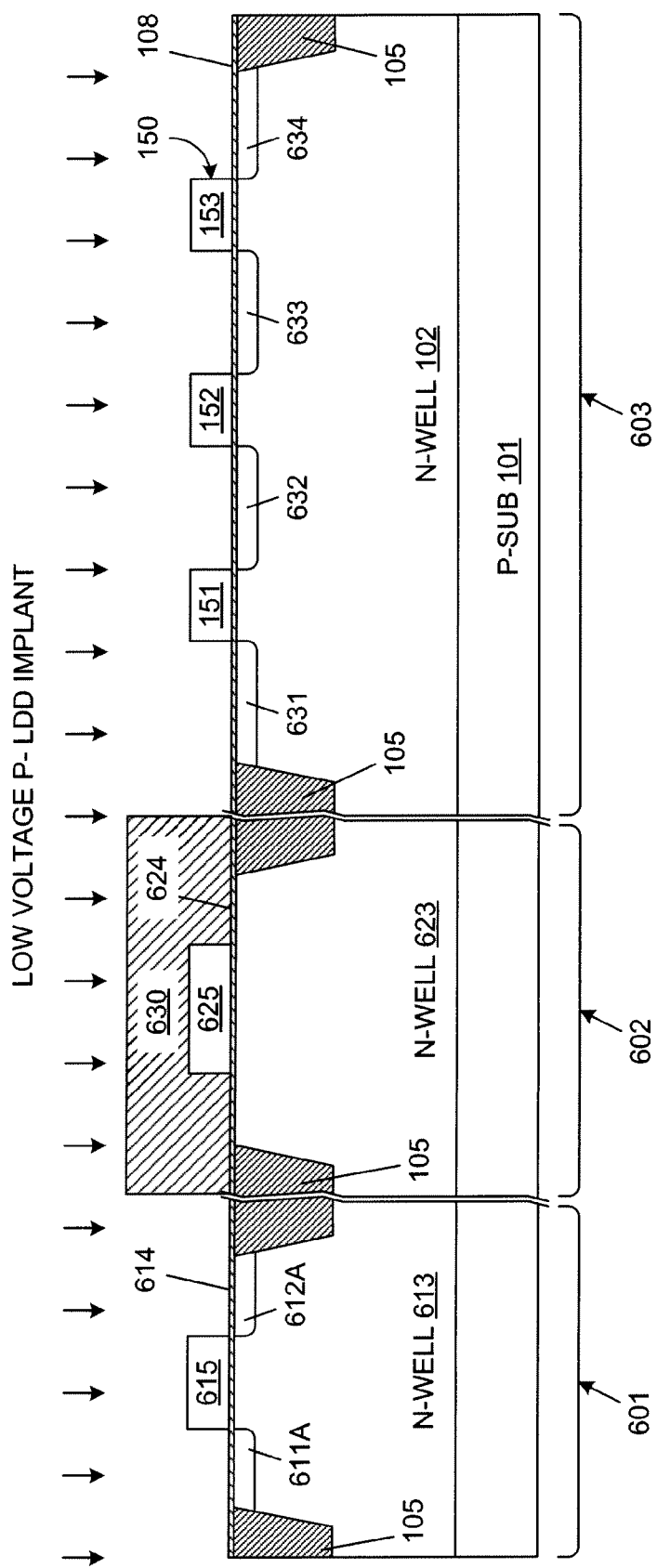
FIGS. 6A, 6B, 6C and 6D are cross-sectional views of the capacitor structure of FIGS. 1-2, along with a low voltage PMOS transistor and a high voltage PMOS transistor, during various processing steps, in accordance with one embodiment of the present invention.

As shown in FIG. 6A, n-type active regions 102, 613 and 623 and field dielectric regions 105 are formed in p-type substrate 101. N-type active regions 102, 613 and 623 may be a continuous n-well region or separate n-well regions. The required p-type well regions (not shown) are also formed. Capacitor dielectric layer 108, low voltage gate dielectric layer 614 and high voltage gate dielectric layer 624 are then formed over the upper surface of the resulting structure. In one embodiment, capacitor dielectric layer 108 and high voltage gate dielectric layer 624 are both formed from the same high voltage (HV) gate oxide layer. For example, capacitor dielectric layer 108 and high voltage gate dielectric layer 624 may be created by a layer of thermally grown silicon oxide having a thickness of about 70 Angstroms. Low voltage dielectric layer 614 can be, for example, a layer of thermally grown silicon oxide having a thickness of about 30 Angstroms. All of the above-described elements are commonly available in a conventional planar CMOS process.

A single polysilicon layer is deposited over the resulting structure. A photoresist mask, which defines the locations of the polysilicon structures to be formed, is formed over the polysilicon layer. An etch is then performed through this photoresist mask, thereby forming low voltage gate electrode 615, high voltage gate electrode 625 and patterned polysilicon structure 150 (which includes polysilicon traces 151-153 as illustrated). As described above in connection with FIGS. 1-4, the patterned polysilicon structure 150 may form a floating gate of a non-volatile memory cell. The photoresist mask is designed such that lines 151-155 of patterned polysilicon structure 150 each has a width of about 0.14 microns, low voltage gate electrode 615 has a width of about 0.18 microns, and high voltage gate electrode 625 has a width of about 0.35 microns. The photoresist mask is then stripped.

As illustrated in FIG. 6A, another photoresist mask 630 is formed over the resulting structure. This photoresist mask 630 exposes all regions which are to receive a low voltage p-type lightly doped drain (LDD) implant (and covers the remaining regions). In accordance with the described embodiment, regions 601 and 603 are exposed through photoresist mask 630, and region 602 is covered by photoresist mask 630. The low voltage p-type LDD implant results in the formation of p-type LDD regions 611A-612A in region 601, and the formation of p-type LDD regions 631-634 in region 603. The p-type LDD regions 611A and 612A are aligned with low voltage gate electrode 615. Similarly, the p-type LDD regions 631-634 are aligned with patterned polysilicon structure 150. The low voltage p-type LDD implant may be performed, for example, by implanting implanting BF2 at a dose of about 4E14 cm−2 and an energy of about 10 keV. Photoresist mask 630 is then stripped.

Figure 6B:
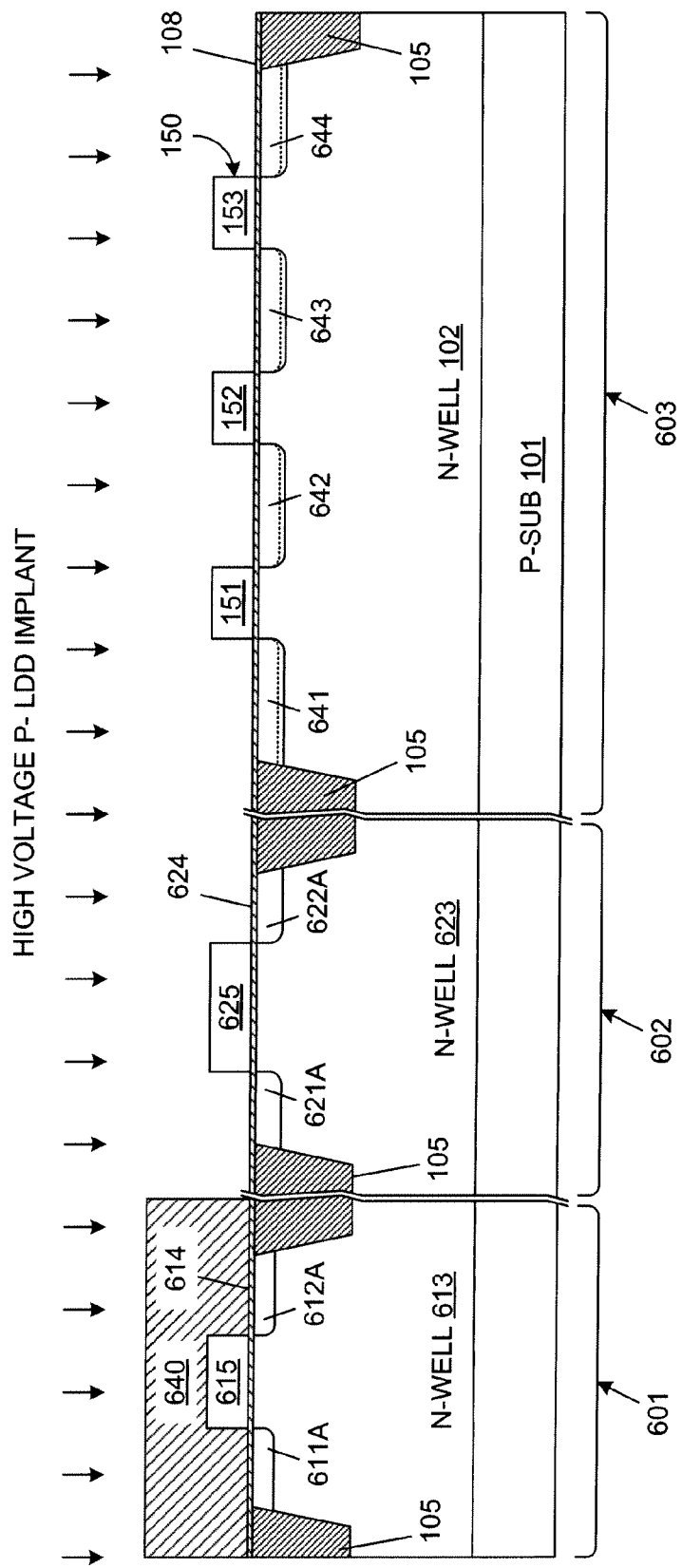

As illustrated in FIG. 6B, another photoresist mask 640 is formed over the resulting structure. This photoresist mask 640 exposes all regions which are to receive a high voltage p-type lightly doped drain (LDD) implant (and covers the remaining regions). In accordance with the described embodiment, regions 602 and 603 are exposed through photoresist mask 640, and region 601 is covered by photoresist mask 640. The high voltage p-type LDD implant results in the formation of p-type LDD regions 621A-622A in region 602, and the formation of p-type LDD regions 641-644 in region 603. The p-type LDD regions 621A and 622A are aligned with high voltage gate electrode 625. Similarly, the p-type LDD regions 641-644 are aligned with patterned polysilicon structure 150. The high voltage p-type LDD implant may be performed, for example, by implanting BF2 at a dose of about 2.5E14 cm−2 and an energy of about 18 keV. Photoresist mask 640 is then stripped.

In accordance with one embodiment of the present invention, p-type LDD regions 641-644 include impurities implanted during both the high voltage p-type LDD implant and the low voltage p-type LDD implant. The dashed lines in regions 641-644 represent the presence of the impurities implanted during the low voltage p-type LDD implant. The dopant concentration in regions 641-644 is therefore greater than the dopant concentration in regions 611A-612A or regions 621A-622A. Although the present invention has described the low voltage p-type LDD implant as occurring before the high voltage p-type LDD implant, this order can be reversed in other embodiments.

Figure 6C:
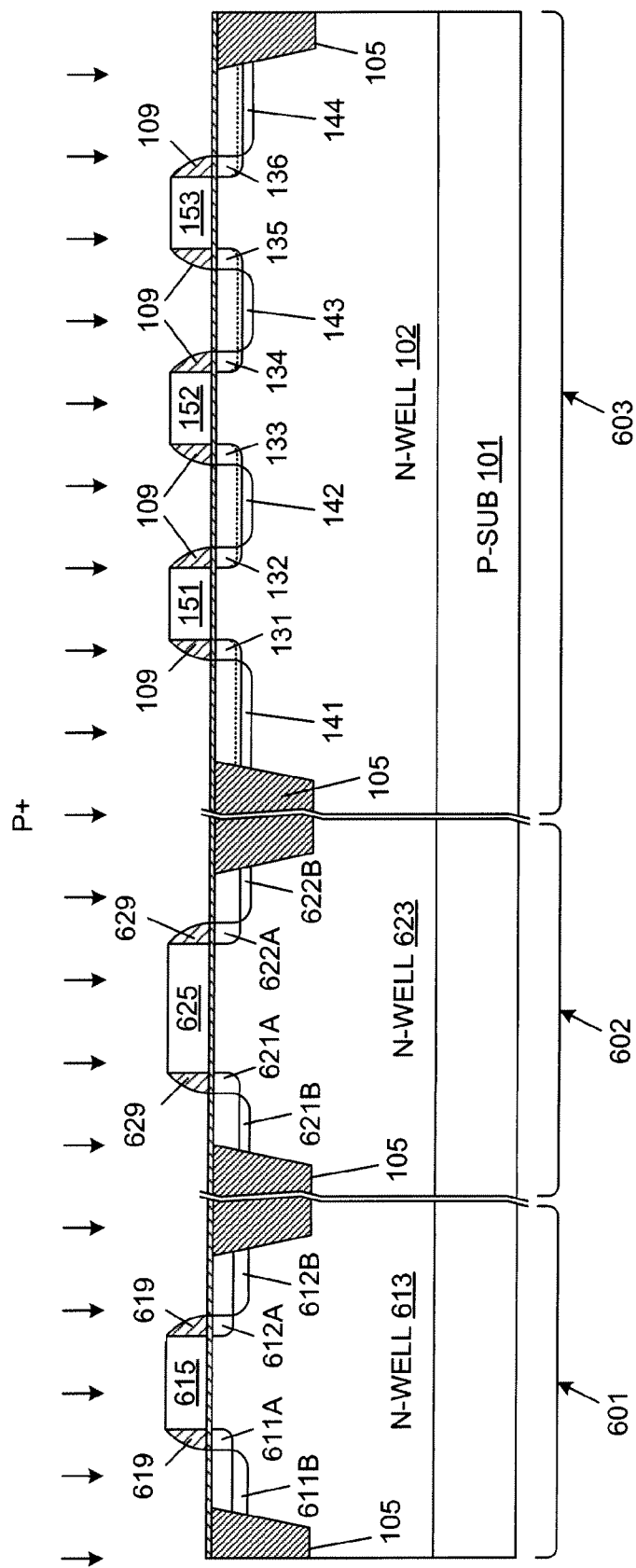

As illustrated in FIG. 6C, dielectric sidewall spacers 109, 619 and 629 are formed adjacent to patterned polysilicon structure 150, low voltage gate electrode 615 and high voltage gate electrode 625, respectively. Dielectric sidewall spacers 109, 619 and 629 can be formed, for example, by silicon nitride, which is deposited and then etched back in a manner well known to those of ordinary skill in the art. Another photoresist mask (not shown) is formed over the resulting structure. This photoresist mask exposes all regions which are to receive a heavily doped P+ implant (and covers the remaining regions). In accordance with the described embodiment, regions 601-603 are exposed through this P+ photoresist mask. The P+ LDD implant results in the formation of P+ type regions 611B and 612B in region 601, the formation of P+ type regions 621B and 622B in region 602, and the formation of P+ type regions 141-144 in region 603. The portions of p-type regions 641-644 that are not included in P+ type regions 141-144 are re-labeled as p-type regions 131-136 in FIG. 6C. Note that P+ type regions 611B and 612B are aligned with dielectric sidewall spacers 619. Similarly, P+ type regions 621B and 622B are aligned with dielectric sidewall spacers 629. P+ type regions 141-144 are aligned with dielectric sidewall spacers 109. The P+ type implant may be performed, for example, by implanting boron at a concentration of about 4*1015 atoms/cm−2 and an energy of about 7 keV. The P+ photoresist mask is then stripped.

Figure 6D:
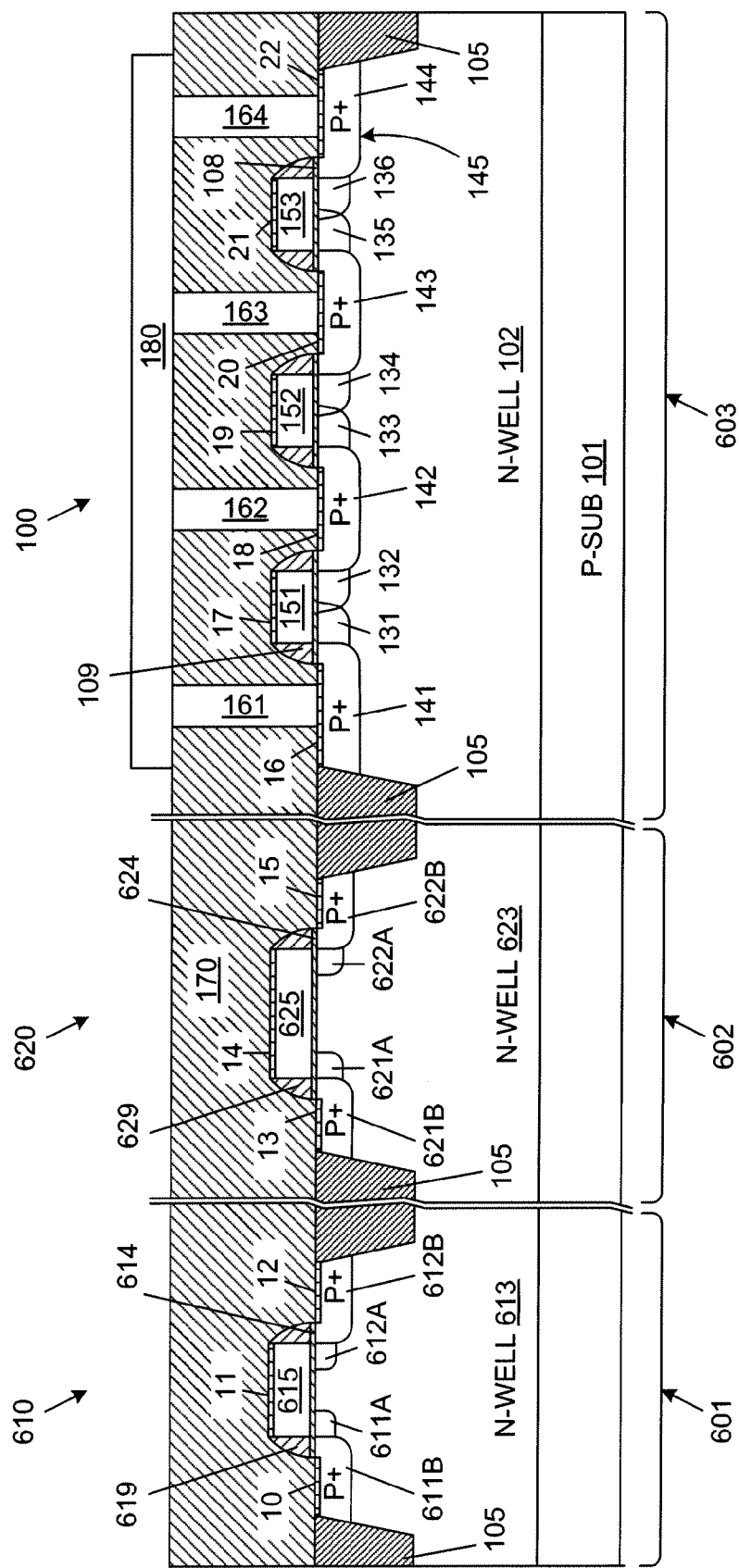

As illustrated in FIG. 6D, back end processing is subsequently performed, which includes forming metal salicide regions 10-21 (e.g., CoSi), depositing pre-metal dielectric 170, forming contacts (including contacts 161-164) through pre-metal dielectric 170 and capacitor dielectric layer 108, and forming a metal-1 layer (which includes metal trace 180) over the resulting structure. Additional dielectric layers and metal layers (not shown) are typically formed over the metal-1 layer.

After the above-described p-type regions have been implanted, a thermal drive-in cycle anneal is performed, which causes the various p-type regions 611A, 612A, 611B, 612B, 621A, 622A, 621B, 622B, 131-136 and 141-144 to diffuse in the manner illustrated in FIG. 6D. In one embodiment, the thermal drive-in cycle includes a thermal process at a temperature of about 1020° C. for about 20 seconds. The relatively high dopant concentration of regions 131-136, along with the relatively narrow width of polysilicon traces 151-153, result in the merging of these p-type regions under polysilicon traces 151-153, thereby forming continuous p-type region 145. Each of p-type regions 131-136 laterally diffuses at least about 0.07 microns in the described example.

Note that the p-type implanted regions do not merge in the PMOS transistors 610 and 620, as these transistors are fabricated in accordance with conventional CMOS processing techniques.

In the foregoing manner, control gate capacitor structure 100 is formed in a conventional CMOS process without adding any process steps.

Advantageously, the continuous p-type region 145 under the patterned polysilicon structure 150 forms a capacitance (C1) that has a weak dependence on voltage. Because capacitor dielectric layer 108 is formed before the continuous p-type region 145, the quality of the capacitor dielectric layer 108 (e.g., silicon oxide) is improved with respect to the prior art, which required that a capacitor dielectric layer be formed over an existing heavily doped diffusion region.

FIGS. 7, 8, 9 and 10 illustrate variations of capacitor structure 100 in accordance with other embodiments of the present invention. Similar elements in FIGS. 1 and 7-10 are labeled with similar reference numbers.

Figure 7:
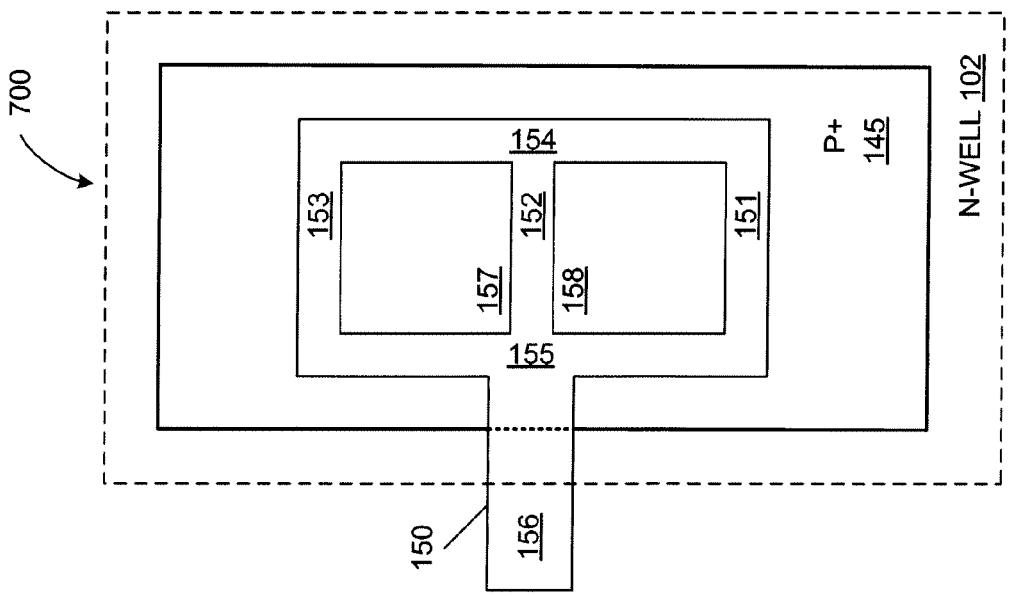

As illustrated in FIG. 7, capacitor structure 700 eliminates contacts 161-164 and metal-1 trace 180 of capacitor structure 100, thereby eliminating capacitive elements C2 and C3, but retaining capacitive element C1.

Figure 8:
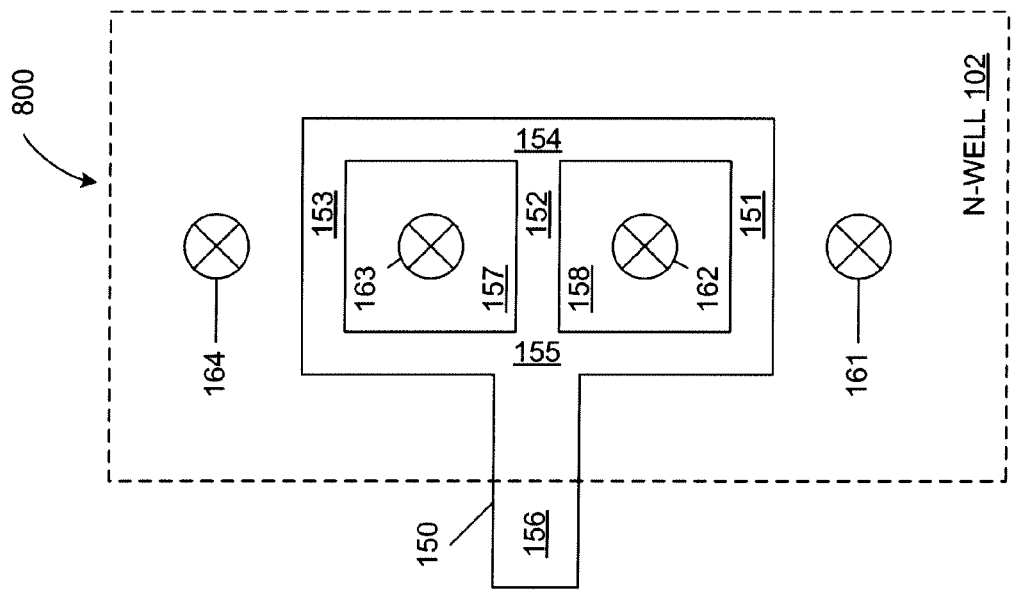
FIGS. 7, 8, 9 and 10 are top views that illustrate variations of the capacitor structure of FIGS. 1-2 in accordance with other embodiments of the present invention.

As illustrated in FIG. 8, capacitor structure 800 eliminates continuous p-type region 145 and metal-1 trace 180 of capacitor structure 100, thereby eliminating capacitance C1 and C3, but retaining capacitive element C2.

Figure 9:
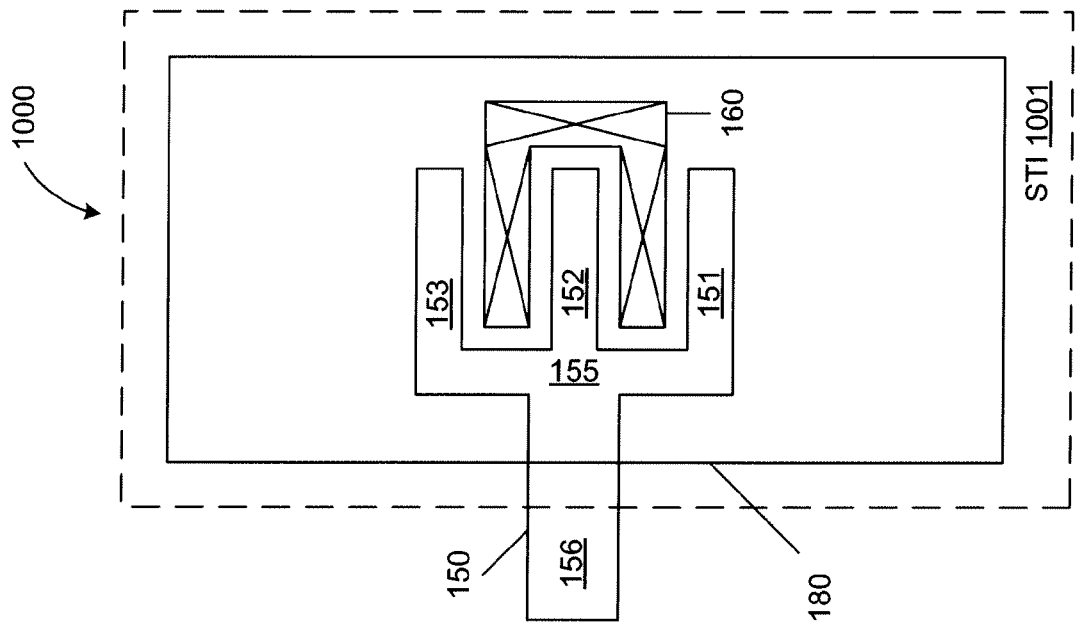

As illustrated in FIG. 9, capacitor structure 900 eliminates narrow polysilicon trace 154 of capacitor structure 100, and replaces contacts 161-164 of capacitor structure 100 with contact structure 160. Contact structure 160 includes flat plates which are positioned parallel to the walls of polysilicon traces 151-153, thereby increasing the capacitance of capacitive element C2.

Figure 10:
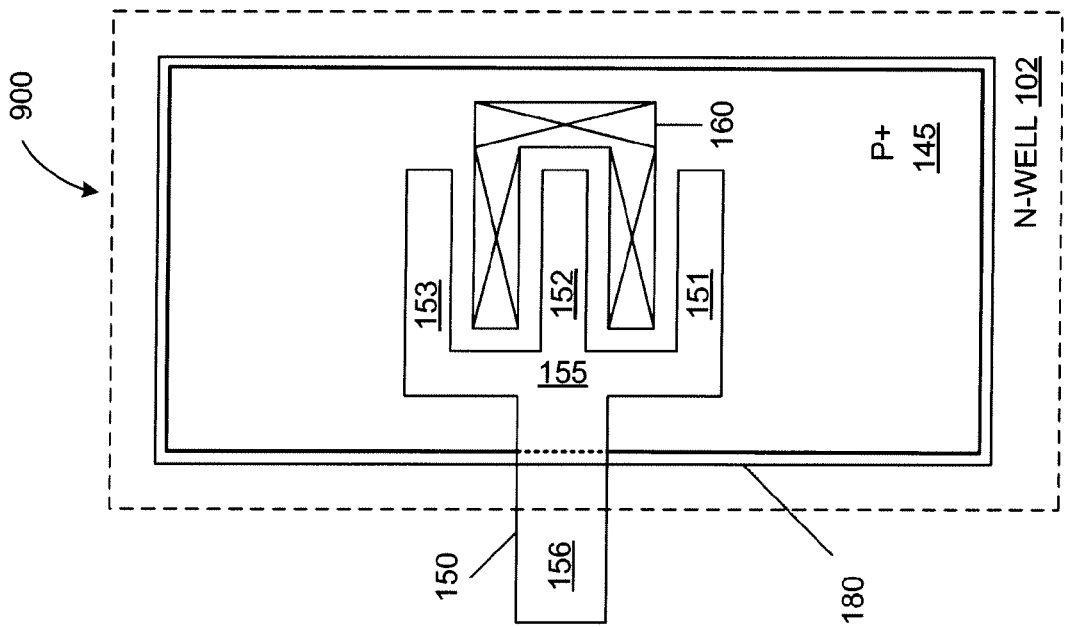

As illustrated in FIG. 10, capacitor structure 1000 can be created by fabricating the capacitor structure 900 of FIG. 9 over a shallow trench isolation region 1001. This may effectively reduce the required layout area (in terms of the required active region of the substrate) of an associated non-volatile memory cell.

Although the invention has been described in connection with several embodiments, it is understood that this invention is not limited to the embodiments disclosed, but is capable of various modifications, which would be apparent to a person skilled in the art. For example, although the present invention was described in terms of a continuous p-type region 145 fabricated in an n-type active region 102, it is understood that these polarities can be reversed in other embodiments. Thus, the invention is limited only by the following claims.

We claim:

1. A method comprising:
    forming a capacitor dielectric layer over a first region of a semiconductor substrate;
    forming a first gate dielectric layer over a second region of the semiconductor substrate;
    forming a first set of one or more polysilicon gate electrodes over the first gate dielectric layer, each having a first width equal to or greater than a minimum gate width;
    forming a patterned polysilicon structure over the capacitor dielectric layer, wherein the patterned polysilicon structure includes one or more narrow polysilicon lines having a width less than the minimum gate width; and then
    performing a first implant, whereby impurities are simultaneously implanted into the first region and the second region of the semiconductor substrate using the patterned polysilicon structure and the first set of one or more polysilicon gate electrodes as a mask; and
    performing a thermal-drive in cycle, wherein the impurities implanted in the first region of the semiconductor substrate diffuse to create a continuous diffusion region under the patterned polysilicon structure, and the impurities implanted in the second region of the semiconductor substrate diffuse to create source/drain regions of a first set of one or more transistors.

2. The method of claim 1, wherein the one or more narrow polysilicon lines define one or more openings in the patterned polysilicon structure, the method further comprising:
    forming a pre-metal dielectric material over the patterned polysilicon structure; and
    forming a first set of one or more contacts extending through the pre-metal dielectric material and the one or more openings in the patterned polysilicon structure, wherein the first set of one or more contacts do not physically contact the patterned polysilicon structure.

3. The method of claim 2, further comprising forming a conductive trace on the pre-metal dielectric material, wherein the conductive trace contacts the first set of one or more contacts.

4. The method of claim 2, further comprising forming a non-volatile memory cell that uses the patterned polysilicon structure as a floating gate.

5. The method of claim 1, further comprising:
    forming a second gate dielectric layer over a third region of the semiconductor substrate;
    forming a second set of one or more polysilicon gate electrodes over the second gate dielectric layer, each having a second width equal to or greater than the minimum gate width; and
    performing a second implant, whereby impurities are simultaneously implanted into the first and third regions of the semiconductor substrate, using the patterned polysilicon structure and the second set of one or more polysilicon gate electrodes as a mask, wherein during the thermal-drive in cycle, the implanted impurities in the third region of the semiconductor substrate diffuse to create source/drain regions of a second set of one or more transistors.

6. The method of claim 5, further comprising performing a third implant, wherein impurities are simultaneously implanted into the first, second and third regions of the semiconductor substrate using the patterned polysilicon structure, the first set of one or more polysilicon gate electrodes, and the second set of one or more polysilicon gate electrodes as a mask.

7. The method of claim 5, wherein the second width is greater than the first width.

8. The method of claim 7, wherein the second gate dielectric layer is thicker than the first gate dielectric layer.

9. The method of claim 8, wherein the capacitor dielectric layer has the same thickness as the second gate dielectric layer.

10. The method of claim 5, further comprising masking the third region of the semiconductor substrate during the first implant.

11. The method of claim 10, further comprising masking the second region of the semiconductor substrate during the second implant.

12. The method of claim 5, wherein the impurities of the first and second implants have the same conductivity type.

13. The method of claim 12, wherein the first and second implants implant the same impurities into the semiconductor substrate.

14. The method of claim 5, further comprising forming dielectric sidewall spacers adjacent to the patterned polysilicon structure, the first set of one or more polysilicon gate electrodes, and the second set of one or more polysilicon gate electrodes, wherein the dielectric sidewall spacers are formed after the first and second implants.

* * * * *